US011031943B1

(12) United States Patent
Gambini et al.

(10) Patent No.: US 11,031,943 B1
(45) Date of Patent: Jun. 8, 2021

(54) LINEAR FREQUENCY RAMP GENERATOR USING MULTI-POINT INJECTION

(71) Applicant: Apple Inc., Cupertino, CA (US)

(72) Inventors: Simone Gambini, San Francisco, CA (US); Chin-Chi Chen, Sunnyvale, CA (US); Axel D. Berny, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/811,459

(22) Filed: Mar. 6, 2020

(51) Int. Cl.
    | | |
    |---|---|
    | *H03L 7/10* | (2006.01) |
    | *H03L 7/18* | (2006.01) |
    | *H03L 7/099* | (2006.01) |
    | *H03C 3/09* | (2006.01) |
    | *G01S 13/34* | (2006.01) |

(52) U.S. Cl.
    CPC ............ *H03L 7/101* (2013.01); *G01S 13/345* (2013.01); *H03C 3/0925* (2013.01); *H03C 3/0941* (2013.01); *H03C 3/0991* (2013.01); *H03L 7/099* (2013.01); *H03L 7/18* (2013.01); *H03L 2207/06* (2013.01)

(58) Field of Classification Search
    CPC .... H03C 3/0941; H03C 3/0925; H03C 3/095; H03C 3/0933; H03C 3/0958; H03C 3/0991; H03L 7/093; H03L 7/099; H03L 2207/06; H03L 7/101; H03L 7/1974; G01S 13/343; G01S 13/345; G01S 7/35; G01S 7/032; G01S 7/4008; G01S 13/32; G01S 7/4056; H03B 5/1243; H03B 5/1265; H03B 5/1212; H03B 5/1262
    See application file for complete search history.

(56) References Cited

U.S. PATENT DOCUMENTS

| | | | |
|---|---|---|---|
| 10,256,826 B2 | 4/2019 | Kim et al. | |
| 10,439,555 B2 * | 10/2019 | Saric | H03B 5/1243 |
| 10,536,154 B2 * | 1/2020 | Kitamura | H03B 5/1265 |
| 10,763,783 B2 * | 9/2020 | Heschl | H03L 7/0898 |
| 2018/0143296 A1 | 5/2018 | Lee et al. | |
| 2019/0190524 A1 | 6/2019 | Freidl et al. | |

* cited by examiner

*Primary Examiner* — Ryan Johnson
(74) *Attorney, Agent, or Firm* — Kowert, Hood, Munyon, Rankin & Goetzel, P.C.

(57) ABSTRACT

A frequency synthesizer circuit included in a sensor circuit of a computer system may include a voltage-controlled oscillator circuit that may generate an oscillator signal. A three-point injection technique may be used to modulate the frequency of the oscillator signal. The three-point injection includes a low-frequency component that drives a feedback divider, and two high-frequency components that drive the voltage-controlled oscillator circuit. The strengths of the three injection points are aligned using samples of a tune signal generated using results of a comparison of a referenced signal and a frequency divided version of the oscillator signal.

17 Claims, 9 Drawing Sheets

LINEAR FREQUENCY RAMP GENERATOR USING MULTI-POINT INJECTION

BACKGROUND

Technical Field

This disclosure relates to sensor circuits in computer systems and more particularly to frequency synthesizer circuits used in sensor circuits.

Description of the Related Art

Modern computer systems may perform certain tasks or operations in response to changes in the environments, in which the computer systems are located. For example, changes in ambient light may result in a computer system adjusted brightness of a display. Additionally, changes in temperature may result in a computer system adjusting a level processing being performed in order to maintain the computer system within designated thermal limits. In some cases, rapid changes in acceleration may result in the computer system taking certain actions to prevent damage to movable parts within the computer system.

To react to changes in environment, a computer system may include multiple sensor circuits designed to detect various effects or situations. For example, such sensor circuit may include temperature sensors, acceleration sensors, ambient light sensors, and the like. The outputs of such sensor circuits may be polled by a processor or controller included in the computer system to determine what actions to perform.

Sensor circuits, such as those described above, may include any suitable combination of logic circuits, analog circuits, radio frequency circuits, and the like. In some cases, sensor circuits may employ active sensing by transmitting signals and monitoring any returning signals. To create signals for transmission, sensor circuits may employ one or more frequency synthesizer circuits to create modulated radio frequency signals for transmission.

SUMMARY OF THE EMBODIMENTS

Various embodiments of a frequency synthesizer circuit are disclosed. Broadly speaking, a frequency synthesizer circuit may include a voltage-controlled oscillator circuit that may be configured to generate an oscillator signal, and a divider circuit that may be configured to divide a frequency of the oscillator signal using a divider ratio to generate a feedback signal. A value of the divider ratio may vary according to a divider control signal. The frequency synthesizer circuit may also include a phase control circuit that may be configured to generate a tune signal using the feedback signal and a reference signal, and a modulation control circuit that may be configured to generate the divider control signal and a plurality of modulation control signals using the tune signal and a linear ramp signal. The voltage-controlled oscillator circuit may be further configured to modulate the frequency of the oscillator signal using the tune signal and the plurality of modulation control signals. In another embodiments, the plurality of modulation control signals includes a fine-tune signal, that may include a plurality of sub-ramps based, at least in part, on the linear ramp signal.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Many computer systems come equipped with various sensors that allow such computer systems to detect various effects and situations. For example, some mobile computer systems include sensors for detecting acceleration and deceleration, ambient temperature, humidity, and the like. In some cases, computer systems include sensors to determine a distance to a particular object. For example, sensors may be employed by a mobile computer system to determine a distance to a desktop computer system, router, etc.

Sensors used to determine a distance or range to an object may often employ radio frequency (RF) signals. Such signals may be transmitted and, in response, echo signals, i.e., versions of the transmitted signals reflected off of the object, may be received and analyzed to determine the distance or range to the object. Depth sensing and mapping sensor may employ a continuous wave approach that relies on a transmitted signal whose frequency varies linearly with time. Using such a transmitted signal results in a single static target appearing as a frequency tone. If there is variation in the linear time-frequency relationship in the transmitted signal, there may be shadowing as well as loss of an ability of the sensor to discriminate between different targets.

Different techniques may be employed to generate the desired linear time-frequency relationship. In one approach, a chirp signal is generated at a baseband frequency using a Coordinate Rotation Digital Computer (CORDIC), a phase accumulator and a digital-to-analog converter (DAC) circuit. The chirp signal may then be up-converted to RF for transmission. While this technique is flexible, it is complex and may result in high power consumption.

Alternatively, a constant-envelope transmitter that uses a modulated carrier frequency generated by a frequency synthesizer circuit may be used. Such frequency synthesizer circuits may employ voltage-controlled oscillator circuits whose frequency is modulated with a linear ramp signal to generate the desired carrier frequency. One technique for performing the modulation is to modulate a divide ratio used by the frequency synthesizer circuit. The inventors have realized, however, that given the frequency excursions required for depth sensing and mapping, modulating the divide ratio results in a need for a large frequency-to-voltage conversion gain (Kvco) for the voltage-controller oscillator circuit. Such values for Kvco may increase phase noise in the voltage-controlled oscillator circuit, as well as increase a sensitivity of the voltage-controlled oscillator circuit to variations in a power supply voltage level. The embodiments illustrated in the drawings and described below provide techniques for operating a frequency synthesizer circuit that uses a three-point modulation injection technique to generate a signal whose frequency varies linearly with time, while reducing a Kvco for a voltage-controlled oscillator. Such an approach may thereby improve the voltage-controlled oscillator circuit's phase noise and supply sensitivity.

Figure 1:
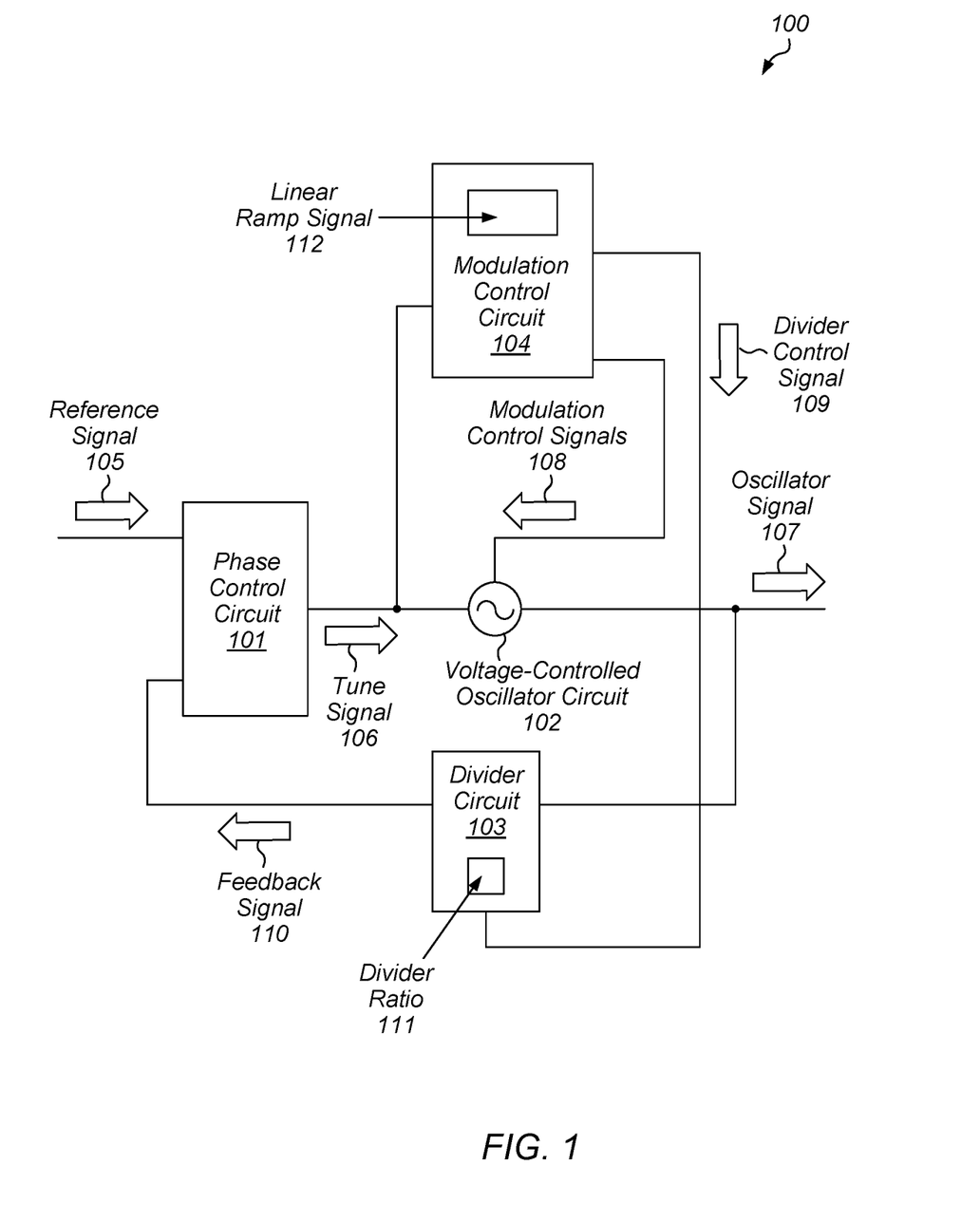
FIG. 1 is a block diagram of an embodiment of a synthesizer circuit.

A block diagram of a frequency synthesizer circuit is depicted in FIG. 1. As illustrated, frequency synthesizer circuit 100 includes phase control circuit 101, voltage-controlled oscillator circuit 102, divider circuit 103, and modulation control circuit 104.

Voltage-controlled oscillator circuit 102 is configured to generate oscillator signal 107. To limit the Kvco of voltage-controlled oscillator circuit 102, additional control ports, coupled to modulation control signals 108, are used to adjust the frequency of oscillator signal 107. Voltage-controlled oscillator circuit 102 is further configured to modulate a frequency of oscillator signal 17 using tune signal 106 and modulation control signals 108. As described below in more detail, voltage-controlled oscillator circuit 102 may include any suitable combination of inductors, capacitors, varactors, and gain devices.

Divider circuit 103 is configured to divide the frequency of oscillator signal 107 using divider ratio 111 to generate feedback signal 110. In various embodiments, a value of divider ratio 111 varies according to divider control signal 109. Divider circuit 103 may, in some embodiments, include multiple flip-flop circuits arranged to change a logical state of feedback signal 110 after a particular number of transitions of oscillator signal 107 have occurred, where the particular number of transitions is based, at least in part, on divider ratio 111.

Phase control circuit 101 is configured to generate tune signal 106 using feedback signal 110 and reference signal 105. In various embodiments, tune signal 106 is an analog signal whose value is based, at least in part, on a difference in phase and/or frequency of feedback signal 110 and reference signal 105. As described below in more detail, phase control circuit 101 may include a phase frequency comparator circuit, a charge pump circuit, and filter circuit.

Modulation control circuit 104 is configured to generate divider control signal 109, and modulation control signals 108 using tune signal 106 and linear ramp signal 112. In some embodiments, divider control signal 109 may correspond to a low-frequency portion of the frequency modulation, while modulation control signals 108 may correspond to a high-frequency portion of the frequency modulation. In addition to the generation of divider control signal 109 and modulation control signals 108, modulation control circuit 104 may be further configured to align the aforementioned signals in order to control the strengths of the effect each modulation injection point has on voltage-controlled oscillator circuit 102. As described below in more detail, to perform such alignment operations, modulation control circuit may be further configured to sample tune signal 106 at various times to generate multiple samples, and perform alignment operations on divider control signal 109 and modulation control signals 108 using the multiple samples.

Figure 2:
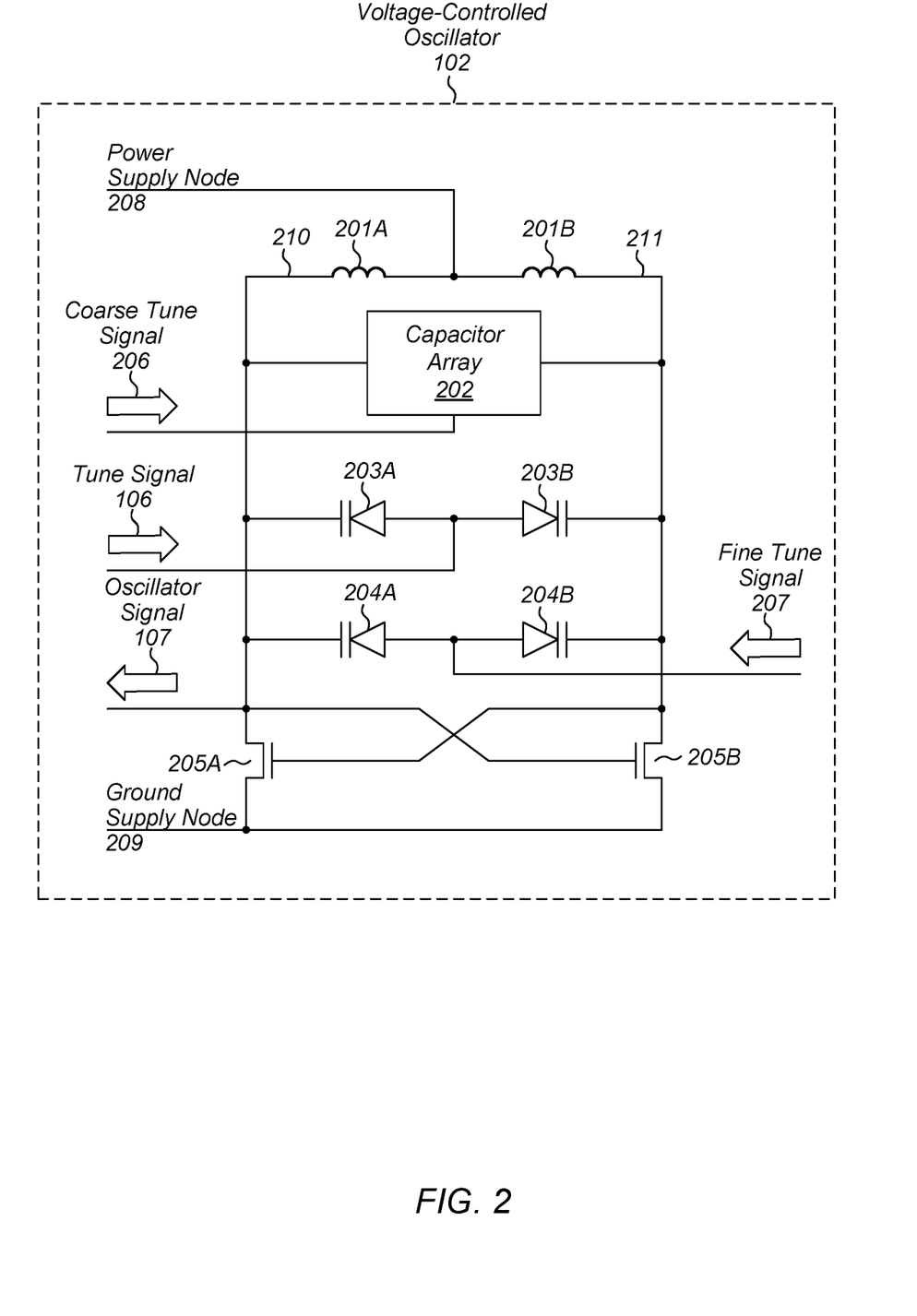
FIG. 2 illustrates a block diagram of an embodiment of a voltage-controlled oscillator circuit.

Turning to FIG. 2, a block diagram of an embodiment of voltage-controlled oscillator circuit 102 is depicted. As illustrated, voltage-controlled oscillator circuit 102 includes inductors 102A and 102B, capacitor array 202, varactors 203A, 203B, 204A, and 204B, and devices 205A-205B.

Inductor 201A is coupled between power supply node 208 and node 210, while inductor 201B is coupled between power supply node 208 and node 211. In various embodiments, the values of inductors 201A and 201B may be selected based on a desired frequency range of voltage-controlled oscillator circuit 102. Inductors 201A and 201B may, in some embodiments, be fabricated on a common silicon substrate with the other components in includes in voltage-controlled oscillator circuit 102. In other cases, inductors 201A and 201B may be located on a different integrated circuit chip from the remaining components of voltage-controlled oscillator circuit 102.

Capacitor array 202 may include multiple capacitors that may be selectively coupled between nodes 210 and 211. Coupling capacitors to or decoupling capacitors from nodes 210 and 211 may vary the frequency of oscillator signal 107 on node 210. In various embodiments, respective pairs of switches may be closed to connect a particular capacitor between nodes 210 and 211. The state of such switches may be determined by coarse tune signal 206. It is noted that although coarse tune signal 206 is depicted as a single wire, in various embodiments, coarse tune signal 206 may include multiple signals, each controlling different pairs of switches included in capacitor array 202.

Varactors 203A and 203B are coupled to nodes 210 and 211, respectively, and are controlled by tune signal 106. In a similar fashion, varactors 204A and 204B are coupled to nodes 210 and 211, respectively, and are controlled by fine tune signal 207. With the inclusion of capacitor array 202 and varactors 204A and 204B, voltage-controlled oscillator circuit 102 has additional injection points for tuning, i.e., adjusting the frequency of oscillator signal 107.

Varactors 203A, 203B, 204A, and 204B may, in various embodiments, be particular embodiments of varactor diodes configured to generated a voltage-controlled capacitance on node 210 and 211. For example, a lower bias voltage on either tune signal 106 or fine tune signal 207 may increase the capacitance of varactors 203A, 203B, 204A, and 204B, thereby changing the frequency of oscillator signal 107. Varactors 203A, 203B, 204A, and 204B may, in various embodiments, be fabricated on a common substrate with the other components of voltage-controlled oscillator circuit 102.

Device 205A is coupled between node 210 and ground supply node 209, and is controlled by a voltage level of node 211. Device 205B is coupled between node 211 and ground supply node 209, and is controlled by a voltage level of node 210. Devices 205A and 205B are connected in a cross-coupled fashion to provide feedback in order to start and maintain oscillation in order to generate oscillator signal 107. In various embodiments, devices 205A and 205B may be particular embodiments of n-channel metal-oxide semiconductor field-effect transistors (MOSFETs), or other suitable transconductance devices. Respective transconductance values of devices 205A and 205B may, in some embodiments, be selected based on a range of capacitance values generated by varactors 203A, 203B, 204A, and 205B, as well as values of inductors 201A and 201B.

Figure 3:
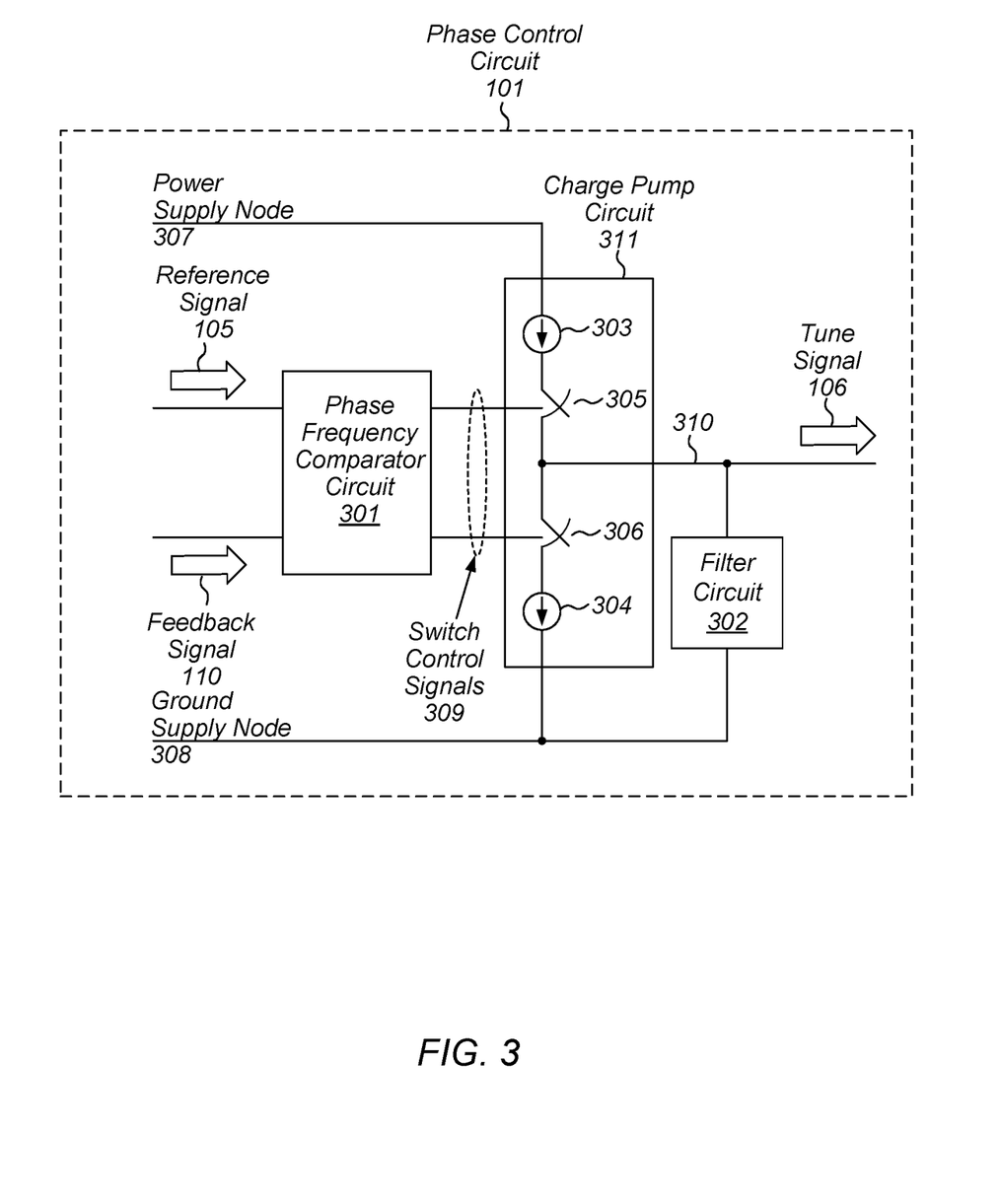
FIG. 3 illustrates a block diagram of an embodiment of a phase frequency detector circuit.

Turning to FIG. 3, a block diagram of phase control circuit 101 is depicted. As illustrated, phase control circuit 101 includes phase frequency comparator circuit 301, filter circuit 302, and charge pump circuit 311, which includes current sources 303 and 304, and switches 305 and 306.

Phase frequency comparator circuit 301 is configured to compare reference signal 105 to feedback signal 110. Using results of the comparison of reference signal 105 and feedback signal 110, phase frequency comparator circuit 301 is configured to generate switch control signals 309. In various embodiments, phase frequency comparator circuit 301 may assert a particular one of switch control signals 309 in response to a determination that the respective phases or frequency of feedback signal 110 and reference signal 105 are different.

Current source 303 is coupled to power supply node 307 and switch 305, which is, in turn coupled to node 310, and is controlled by a particular one of switch control signals 309. When the particular one of switch control signals 309 is asserted, switch 305 may close, allowing current source 303 to source current to node 310, thereby increasing a voltage level of tune signal 106.

Current source 304 is coupled to ground supply node 308 and switch 306, which is, in turn, coupled to node 310, and is controlled by a different one of switch control signals 309. In response to an assertion of the different one of switch control signals 309, switch 306 may close, allowing current source 304 to sink current from node 310, thereby reducing a voltage level of tune signal 106.

Currents sources 303 and 304 may be implemented according to a variety of design styles. For example, current sources 303 and 304 may include one or more current mirrors or other suitable circuits configured to source or sink a given current independent of a voltage on a node to which the given current is being sourced or sunk.

Each of switches 305 and 306 may include one or more MOSFETs. In some cases, each of switches 305 and 306 may include one n-channel MOSFET and one p-channel MOSFET arranged as a pass gate. It is noted that, in other embodiments, any suitable switching device may used to implement switches 305 and 306.

Small changes in the voltage level of tune signal 106 may result from capacitive coupling of switch control signals 309 into node 310. The small changes in voltage (referred to herein as "ripple" or "noise") may produce undesirable changes in a frequency of oscillator signal 107. To remediate the effects of the noise included in tune signal 106 phase control circuit 101 employs filter circuit 302 to filter tune signal 106. Filter circuit 302 is coupled to node 310 and ground supply node 308, and, as described below, in configured to attenuate certain frequency components included in tune signal 106.

Figure 4:
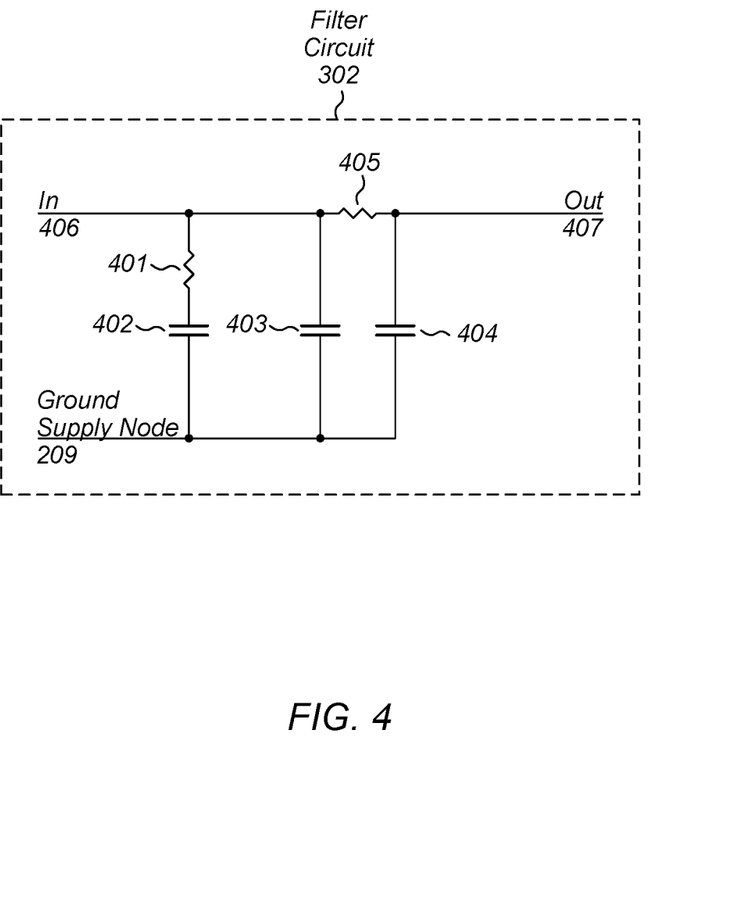
FIG. 4 illustrates a block diagram of an embodiment of a filter circuit.

As described above, filter circuit 302 is used to attenuate undesirable frequency components included in tune signal 106. Filter circuits, such as filter circuit 302, may be implemented according to various circuit topologies. A block diagram of an embodiment of filter circuit 302 is depicted in FIG. 4. As illustrated, filter circuit 302 includes resistor 401, capacitors 402-404, and resistor 405.

Resistor 401 is coupled between node In 406 and capacitor 402, which is coupled to ground supply node 209. The resistance of resistor 401 in series with the reactance of capacitor 402 provide a frequency-dependent impedance from node 406 to ground supply node 209. In various embodiments, a value of resistor 401 and capacitor 402 may be selected to provide a low impedance at frequencies above a threshold value. Frequency components included in a signal on node In 406, which are higher than the threshold value are shunted to ground, thereby reducing the noise of signal on node In 406.

Resistor 405 is coupled between node In 406 and node Out 407. Capacitor 403 is coupled between node In 406 and ground supply node 209, and capacitor 404 is coupled between node Out 407 and ground supply node 209. Resistor 405 and capacitors 403 and 403 may, in various embodiments, form a pi-filter, which is configured to reduce ripple (i.e., noise) on node In 406 to generate a filtered signal on node Out 407.

Capacitor 403 may reduce the ripple on node In 406, while resistor 405 and capacitor 404, further reduce the ripple on the signal received on node In 406. In various embodiments, capacitor 404 provides a near infinite impedance to a direct current (DC) component of a signal on node Out 407. It is noted that resistor 405 reduces a DC level of the signal on node In 406 to generate the signal on node Out 407.

The arrangement of capacitors and resistors in the embodiment depicted in FIG. 4 is merely an example. In other embodiments, other passive components, e.g. inductors, as well as active filter circuits, may be employed.

As described above, frequency synthesizer circuit 100 employs a three-point modulation injection technique. Like 2-point injection techniques, the modulation signal is split into a high-frequency portion and a low-frequency portion. The low-frequency portion is used to drive divider circuit 103, while the high-frequency portion is used to drive voltage-controlled oscillator circuit 102. To ensure proper operation, the low-frequency portion and the high-frequency portion need to be matched in both timing and amplitude.

Give the large frequency excursions, e.g., 2 GHz, needed to perform depth sensing and mapping, the use of a single high-frequency control port on voltage-controlled oscillator circuit 102 still results in large voltage-to-frequency gain values, which can increase phase noise and sensitivity to supply noise. To remediate this problem, modulation control circuit 104 is, as described below, configured to split the high-frequency portion of the modulation signal into two signals.

Figure 5:
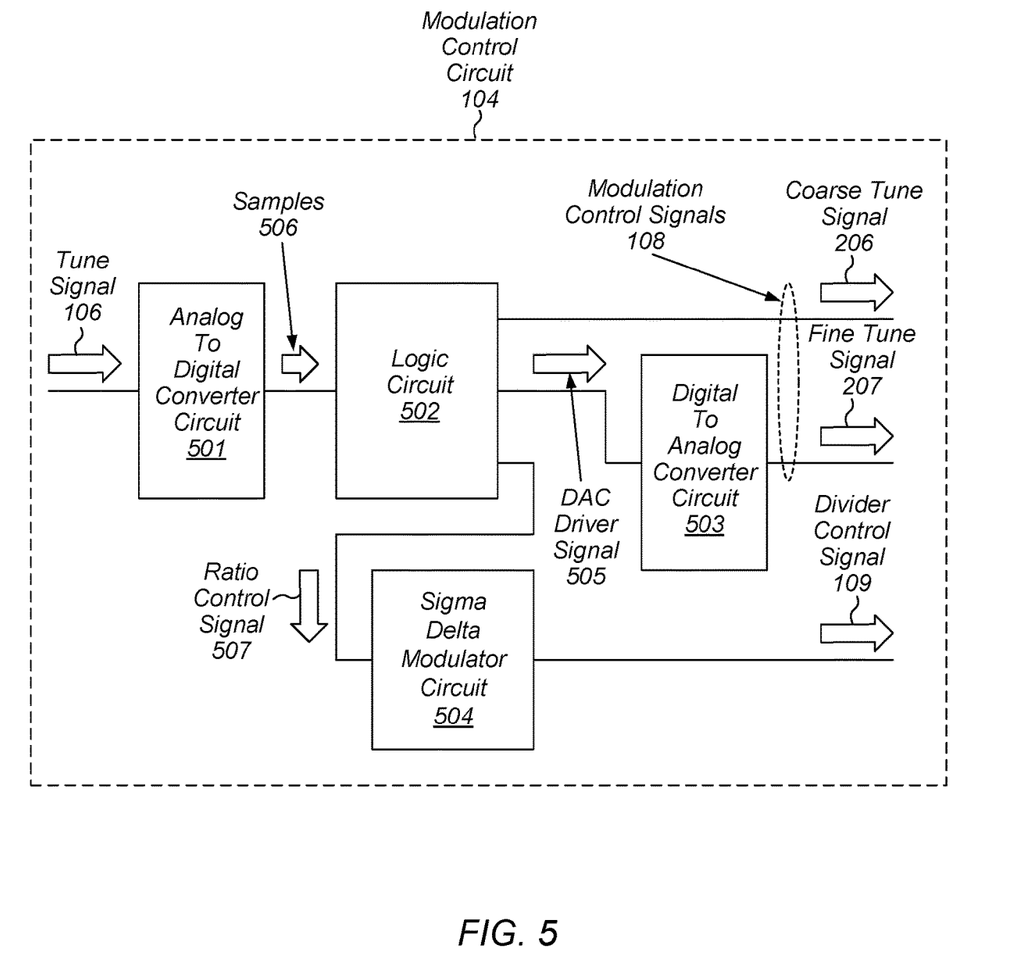
FIG. 5 illustrates a block diagram of an embodiment of a modulation control circuit.

Turning to FIG. 5, a block diagram of modulation control circuit 104 is depicted. As illustrated, modulation control circuit includes analog-to-digital converter circuit 501, logic circuit 502, digital-to-analog converter circuit 503, and sigma delta modulator circuit 504. Modulation control circuit 104 is configured to generate divider control signal 109 and modulation control signals 108, which include coarse tune signal 206 and fine tune signal 207. In various embodiments, coarse tune signal 206 and fine tune signal 207 correspond to the high-frequency portion of the modulation signal.

Analog-to-digital converter circuit 501 is configured to sample tune signal 106 at multiple points to generate samples 506. In various embodiments, analog-to-digital converter circuit 501 gathers samples in regions before and after a fold of fine tune signal 207. Additionally, analog-to-digital converter circuit 501 may be configured to gather samples near the maximum and minimum levels of divider control signal 109. As described below, both sets of samples may be used by logic circuit 502 to align the control strength of the three ports (the divider port and the two voltage-controlled oscillator ports).

Logic circuit 502 may, in various embodiments, be a particular embodiment of a state machine or other processing circuit, configured to generate coarse tune signal 206, DAC driver signal 505 and ratio control signal 507, each of which may a digital signal including respective pluralities of bits. It is noted that different signals may employ different number of bits based, at least in part, on a desired resolution of the corresponding signal.

To generate ratio control signal 507, logic circuit 502 is configured to change a set of bits corresponding to ratio control signal 507 according to linear ramp signal 112. It is noted that linear ramp signal 112 may be generated external to logic circuit 502, and may be represented using a time varying set of bits. In various embodiments, a particular value of the set of bits corresponds to a particular value of divider ratio 111. As described below, ratio control signal 507 may be converted to an analog signal using sigma delta modulator circuit 504.

To generate fine tune signal 207, logic circuit 502 is configured to generate a plurality of sub-ramps by folding linear ramp 112 each time a fixed number of least significant bits (LSBs) or coarse tune signal 206 is encountered. This generation may be performed in the digital domain by incrementing and resetting a set of bits corresponding included in DAC driver signal 505. The duration of a given one of the sub-ramps may be adjusted during alignment operations. It is noted that since the duration of the ramp is fixed and that the amplitude of fine tune signal 207 is adjusted to match the amplitude of coarse tune signal 206, a non-integer number of sub-ramps may occur during each full frequency ramp.

To generate coarse tune signal 206, logic circuit 502 is further configured to decrement (or increment), by a constant amount, a value associated with a set of bits corresponding to coarse tune signal 206 each time fine tune signal 207 is folded, i.e., reset to a starting value.

As previously noted, the control strength of the ports needs to be aligned. Such alignment is needed due to non-ideal behavior. For example, around folding point, tune signal 106 may quickly change, up or down, when fine tune signal 207 and coarse tune signal 206 are not well aligned. In particular, for the case of a non-inverting varactor (positive Kv), if the frequency change exerted by fine tune signal 207 is greater than the frequency change exerted by coarse tune signal 206, there may be a positive jump on tune signal 106. Alternatively, there may be a negative jump on tune signal 106 if the frequency change exerted by coarse tune signal 206 is greater than that exerted by fine tune signal 207.

Another source of non-ideal behavior results in a drift of tune signal 106 over the duration of a frequency ramp. The direction of the drift may be based, at least in part, on whether the modulation of voltage-controlled oscillator circuit 102 is stronger or weaker than the modulation injected into divider circuit 103.

Logic circuit 502 is configured to use particular ones of samples 506 taken near the folding point, to minimize misalignment between fine tune signal 207 and coarse tune signal 206. To minimize the misalignment, logic circuit 502 may be configured to perform a least mean squares (LMS) adaption loop to minimize a different between two of samples 506 from different sides of a fold. Logic circuit 502 may be further configured to perform a second LMS adaptation loop to adjust the duration of each sub-ramp using particular ones of samples 506 corresponding to the maximum and minimum values of tune signal 106. Logic circuit 502 may be further configured to perform another LMS adaptation loop to adjust a maximum drive associated with coarse tune signal 206 using the samples corresponding to the maximum and minimum values of tune signal 106 in addition to reference signal 105.

Digital-to-analog converter circuit 503 is configured to generate fine tune signal 207 by converting DAC driver signal 505 into an analog signal. In various embodiments, digital-to-analog converter circuit 503 may be a particular embodiment of a binary-weighted digital-to-analog converter circuit that may include switched resistors, switched current sources, switch capacitors, or any other suitable circuits configured to incrementally change a voltage level of fine tune signal 207 based on a value of DAC driver signal 505.

Sigma delta modulator circuit 504 is configured to generate divider control signal 109 using ratio control signal 507. In various embodiments, sigma delta modulator circuit 504 is configured to encode ratio control signal 507 into a lower resolution signal that is mapped to corresponding voltage levels. In some cases, sigma delta modulator circuit 504 may employ a filter circuit to smooth the voltages generated by the encoding.

Figure 6:
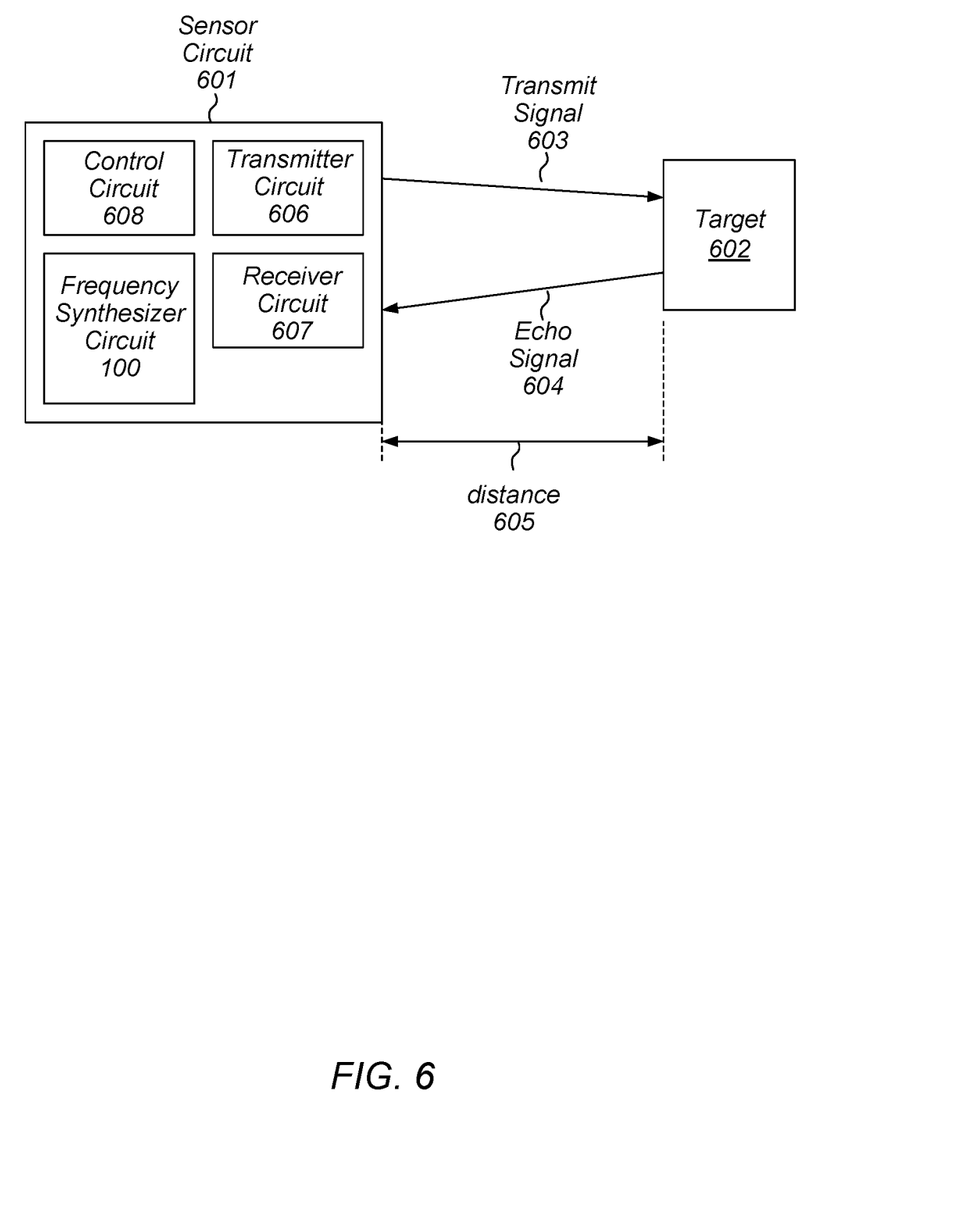
FIG. 6 illustrates a block diagram of a sensor circuit that includes a synthesizer circuit.

As previously mentioned, a frequency synthesizer circuit, such as frequency synthesizer circuit 100, may be used as part of a sensor circuit configured to perform depth sensing and mapping. A block diagram of an embodiment of such a sensor circuit is depicted in FIG. 6. As illustrated, sensor circuit 601 includes transmitter circuit 606, receiver circuit 607, control circuit 608, and frequency synthesizer circuit 100. FIG. 6 further illustrates target 602 located distance 605 from sensor circuit 601.

As described above, frequency synthesizer circuit 100 is configured to generate an oscillator signal and modulate the frequency of the oscillator signal. Transmitter circuit 606 is configured to generate transmit signal 603 using the modulated oscillator signal generated by frequency synthesizer circuit 100.

Transmit signal 603 is reflected off of target 602 to generate echo signal 604. Receiver circuit 607 is configured to receive echo signal 604. In various embodiments, receiver circuit 607 may include filter circuits, amplifier circuits, and circuits to down-converter a frequency of echo signal 604 from radio frequencies.

Due to the transit time from sensor circuit 601 to target 602, and then back to sensor circuit 601, echo signal 604 is delayed from transmit signal 603. The delay can be used to determine a value for distance 605. Rather than trying to directly measure the delay, sensor circuit 601 can determine the delay by determining the frequency of echo signal 604. Since there is a know time-frequency relationship for transmit signal 603 (as generated by frequency synthesizer circuit 100), knowing the frequency of echo signal 604 allows the calculation of the delay and, therefore, a value of distance 605.

Control circuit 608 is configured to determine, using echo signal 604, to determine a value for distance 605. In some cases, control circuit 608 may convert echo signal 604 from the time domain to the frequency domain to perform the calculations for determining the value of distance 605. In various embodiments, control circuit 608 may be a dedicated state machine, or general-purpose processor circuit configured to execute software or program instructions to implement the aforementioned calculations.

It is noted that the use of frequency synthesizer circuit 100 in sensor circuit 601 is merely an example and does not limit the scope of applications for which frequency synthesizer circuit 100 may be employed.

Figure 7:
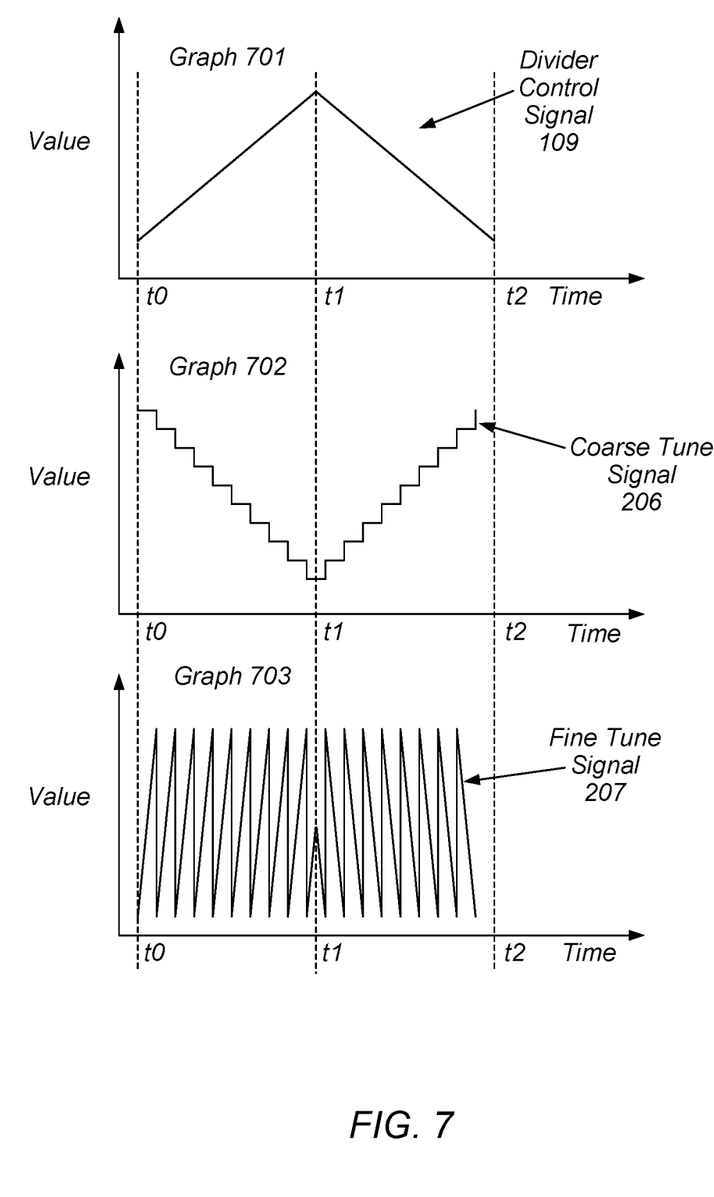
FIG. 7 illustrates example waveforms of a coarse tune signal, a fine tune signal and divider control signal.

Turning to FIG. 7, example waveforms associated with the operation of frequency synthesizer circuit 100 are illustrated. It is noted that waveforms depicted are examples, and that, in various embodiments, the waveforms may vary.

Graph 701 depicts divider control signal 109 as a function of time. At time to, divider control signal 109 increases linearly in value until time t1. During this time, divider ratio 111 is changing, in a linear fashion, in response to the change in divider control signal 109. The change in divider ratio 111 results in a change in frequency of feedback signal 110, which results in a change in tune signal 106. The change in tune signal 106 causes voltage-controlled oscillator circuit 102 to change the frequency of oscillator signal 107. At time t1, the slope of divider control signal 109 changes, and the divider control signal 109 decreases until time t3, at which the point the cycle repeats. As noted above, in portions of frequency synthesizer circuit 100, divider control signal 109 may be represented in the digital domain by a set of bits, whose values change linearly in time.

Graph 702 depicts coarse tune signal 206. As described above, coarse tune signal 206 includes a plurality of bits, whose combined value is decremented (or incremented) over a period of time during which divider control signal 109 is increasing (or decreasing). Each decrement (or increment) changes the value of coarse tune signal 206 by a constant amount. As described above, each decrement (or increment) is triggered by the start of a new sub-ramp included in fine tune signal 207.

Graph 703 depicts fine tune signal 207. As illustrated, fine tune signal includes a plurality of rising edge sub-ramps, starting at time t0 and continuing to time t1. At time t1, there is a partial sub-ramp, as divider control signal 109 switches from linearly increasing to linearly decreasing. From time t1 to time t2, fine tune signal 207 includes a plurality of falling edge sub-ramps corresponding to the decreasing value of divider control signal 109. Like divider control signal 109, fine tune signal 207 may, in various portions of frequency synthesizer circuit 100, be represented in the digital domain by a set of bits. During the rising edge of a given sub-ramp, the value of the set of bits increases in a linear fashion from an initial value. When the sub-ramp reaches its maximum value, the set of bits is reset to the initial value and the process repeats. During a falling edge of a given one of the failing edge sub-ramps, the set of bits starts at an initial value and then is decremented until the sub-ramp reaches is minimum value, at which point the set of bits is reset to the initial value.

Figure 8:
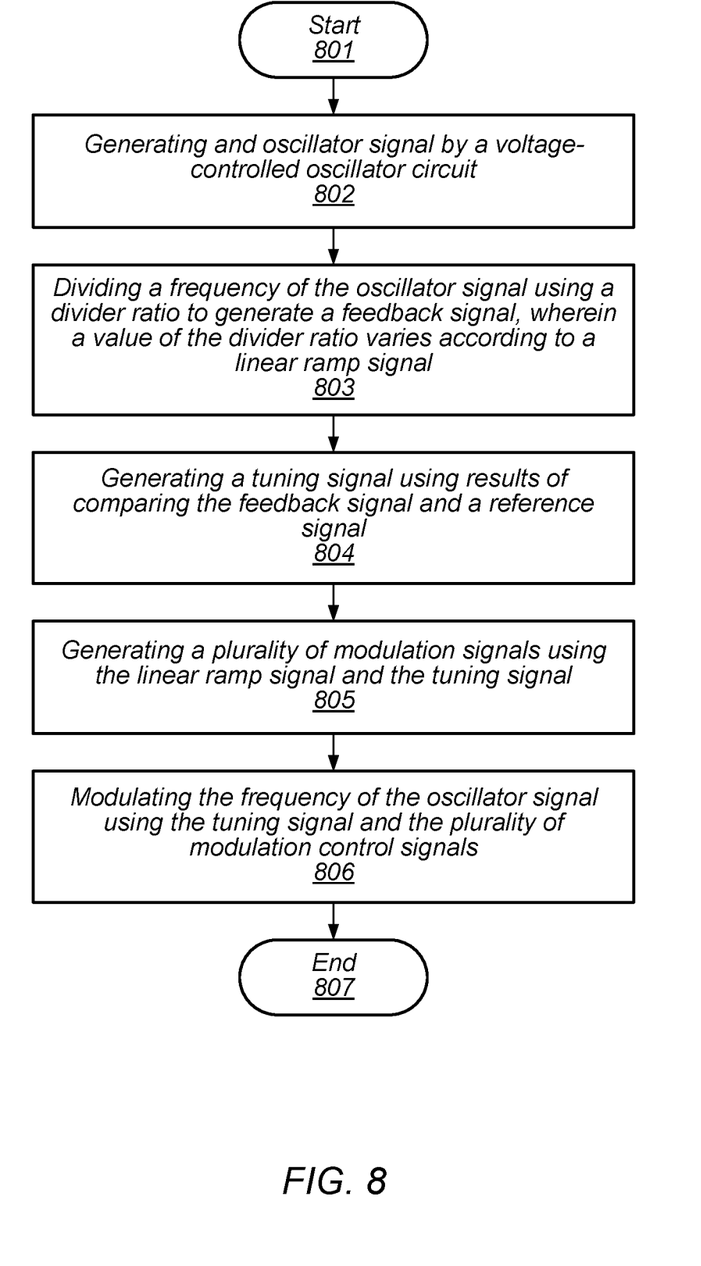
FIG. 8 illustrates a flow diagram depicting an embodiment of a method for operating synthesizer circuit.

Turning to FIG. 8, a flow diagram depicting an embodiment of a method for operating a synthesizer circuit is illustrated. The method, which begins in block 801, may be applied to frequency synthesizer circuit 100 or any other suitable sensor circuit.

The method includes generating an oscillator signal by a voltage-controlled oscillator signal (block 802). In some embodiments, the voltage-controlled oscillator may include multiple inductors, multiple capacitors, multiple varactors, and multiple devices.

The method further includes dividing a frequency of the oscillator signal using a divider ratio to generate a feedback signal, wherein a value of the divider ratio varies according to a linear ramp signal (block 803). In various embodiments, dividing the frequency of the oscillator signal includes dividing the frequency the frequency of the oscillator signal using a first divider ratio for a first period of time, and dividing the frequency of the oscillator signal using a second divider ratio for a second period of time, wherein the second divider ratio is different than the first divider ratio, and the second time period is different from the first time period.

The method also includes generating a tune signal using results of comparing the feedback signal and a reference signal (block 804). In some embodiments, generating the tune signal may include generating a plurality of switch control signals using results of comparing the feedback signal and the reference signal, and selectively sourcing current to or sinking current from a circuit node using the plurality of switch control signals to generate the tune signal.

The method further includes generating a plurality of modulation signals using the linear ramp signal (block 805). In various embodiments, the plurality of modulation signals includes a fine-tune signal that includes a plurality of sub-ramps based, at line in part, on the linear ramp signal. In some cases, the plurality of modulation signals includes a coarse-tune signal that includes a plurality of bits encoding a number. The method may also include, in response to detecting a start of given sub-ramp of the plurality of sub-ramps, decrementing the number by a constant value.

In some cases, the method may include aligning the coarse-tune signal and the fine-tune signal using a plurality of samples of the tune signal. The method may further include adjusting a duration of a given sub-ramp of the plurality of sub-ramps using the plurality of samples of the tune signal. The method may also include adjusting the coarse-tune signal using the reference signal and the plurality of samples of the tune signal.

The method also includes modulating the frequency of the oscillator signal using the tune signal and the plurality of modulation control signals (block 806). In various embodiments, modulating the frequency of the oscillator signal may include: adjusting a first value of a first varactor coupled to an output node of the voltage-controlled oscillator circuit, adjusting a second value of a second varactor coupled to the output node of the voltage-controlled oscillator circuit, and adjusting a number of capacitors coupled to the output node of the voltage-controlled oscillator circuit using the coarse-tune signal. The method concludes in block 807.

Figure 9:
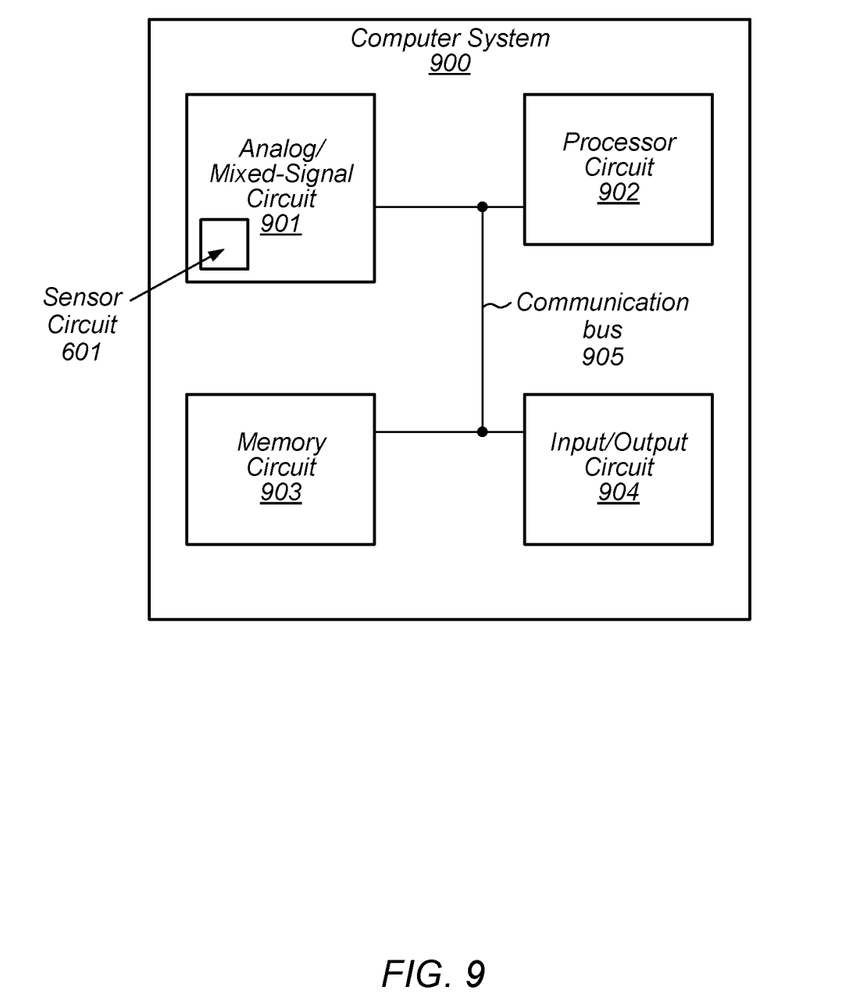
FIG. 9 is a block diagram of one embodiment of a computer system that includes a sensor circuit.

A block diagram of computer system is illustrated in FIG. 9. As illustrated embodiment, the computer system 900 includes analog/mixed-signal circuits 901, processor circuit 902, memory circuit 903, and input/output circuits 904, each of which is coupled to communication bus 905. In various embodiments, computer system 900 may be a system-on-a-chip (SoC) and be configured for use in a desktop computer, server, or in a mobile computing application such as, a tablet, laptop computer, or wearable computing device.

Analog/mixed-signal circuits 901 includes a variety of circuits includes sensor circuit 601 as depicted in FIG. 6. Additionally, analog/mixed-signal circuits 901 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 901 may be configured to perform power management tasks with the inclusion of on-chip power supplies and voltage regulators.

Processor circuit 902 may, in various embodiments, be representative of a general-purpose processor that performs computational operations. For example, processor circuit 902 may be a central processing unit (CPU) such as a microprocessor, a microcontroller, an application-specific integrated circuit (ASIC), or a field-programmable gate array (FPGA).

Memory circuit 903 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 9, a single memory circuit is depicted. In other embodiments, any suitable number of memory circuits may be employed.

Input/output circuits 904 may be configured to coordinate data transfer between computer system 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol or IEEE 1394 (Firewire®) protocol.

Input/output circuits 904 may also be configured to coordinate data transfer between computer system 900 and one or more devices (e.g., other computing systems or integrated circuits) coupled to computer system 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a voltage-controlled oscillator circuit configured to generate an oscillator signal;
   a divider circuit configured to divide a frequency of the oscillator signal using a divider ratio to generate a feedback signal, wherein a value of the divider ratio varies according to a divider control signal;
   a phase control circuit configured to generate a tune signal using the feedback signal and a reference signal;
   a modulation control circuit configured to:
     generate a first plurality of bits indicative of a plurality of sub-ramps using a linear ramp signal;
     in response to respective starts of the plurality of sub-ramps, decrement, by a constant value, a value encoded in a second plurality of bits to generate a coarse-tune signal; and
     generate the divider control signal and a plurality of modulation control signals using the tune signal and the linear ramp signal; and
   wherein the voltage-controlled oscillator circuit is further configured to modulate a frequency of the oscillator signal using the tune signal and the plurality of modulation control signals.

2. The apparatus of claim 1, wherein the modulation control circuit includes a digital-to-analog converter circuit configured to generate a fine-tune signal using the first plurality of bits.

3. The apparatus of claim 2, wherein the modulation control circuit is further configured to align the fine-tune signal and the coarse-tune signal using respective samples of the tune signal sampled at a first time point and a second time point.

4. The apparatus of claim 2, wherein the modulation control circuit is further configured to adjust a duration of a particular sub-ramp of the plurality of sub-ramps using a first sample of the tune signal and a second sample of the tune signal, wherein the first sample is sampled when the linear ramp signal is within a first threshold value of its maximum value, and wherein the second sample is sampled when the linear ramp signal is within a second threshold value of its minimum value.

5. The apparatus of claim 1, wherein the phase control circuit includes:
   a phase frequency comparator circuit configured to generate a plurality of switch control signals using results of a comparison of the frequency divided version of the oscillator signal and the reference signal;
   a charge pump circuit configured to selectively source current to or sink current from a circuit node to generate the tune signal; and a filter circuit configured to filter the tune signal.

6. A method, comprising:

generating an oscillator signal by a voltage-controlled oscillator circuit;

dividing a frequency of the oscillator signal using a divider ratio to generate a feedback signal, wherein a value of the divider ratio varies according to a linear ramp signal;

generating a tune signal using results of comparing the feedback signal and a reference signal;

generating a plurality of modulation control signals using the linear ramp signal and the tune signal, wherein the plurality of modulation control signals includes a fine-tune signal that includes a plurality of sub-ramps based on the linear ramp signal; and modulating the frequency of the oscillator signal using the tune signal and the plurality of modulation control signals.

7. The method of claim 6, wherein the plurality of modulation control signals includes a coarse-tune signal that includes a plurality of bits encoding a number, and further comprising, in response to detecting a start of a given sub-ramp of the plurality of sub-ramps, decrementing the number by a constant value.

8. The method of claim 7, further comprising, aligning the coarse-tune signal and the fine-tune signal using a plurality of samples of the tune signal.

9. The method of claim 7, further comprising, adjusting a duration of a given sub-ramp of the plurality of sub-ramps using a plurality of samples of the tune signal.

10. The method of claim 7, further comprising, adjusting a drive strength associated with the coarse-tune signal using the reference signal and a plurality of samples of the tune signal.

11. The method of claim 7, wherein modulating the frequency of the oscillator signal includes:

adjusting a first value of a first varactor coupled to an output node of the voltage-controlled oscillator circuit using the tune signal;

adjusting a second value of a second varactor coupled to the output node of the voltage-controlled oscillator circuit using the fine-tune signal; and adjusting a number of capacitors coupled to the output node of the voltage-controlled oscillator circuit using the coarse-tune signal.

12. An apparatus, comprising:

a frequency synthesizer circuit configured to:
generate an oscillator signal;
generate a feedback signal using the oscillator signal and a time-varying divider ratio;
generate a tune signal using the feedback signal and a reference signal;
generate the time-varying divider ratio using the tune signal and a linear ramp signal;
generate a fine-tune signal using the linear ramp signal, wherein the fine-tune signal includes a plurality of sub-ramps;
generate a coarse-tune signal using the plurality of sub-ramps; and
modulate a frequency of the oscillator signal using the tune signal and the fine-tune signal and the coarse-tune signal; and a transmitter circuit configured to generate a transmit signal using the oscillator signal;

a receiver circuit configured to receive an echo signal that is a reflected version of the transmit signal; and a control circuit configured to determine, using the echo signal, a distance to an object that reflected the transmit signal to create the echo signal.

13. The apparatus of claim 12, wherein the coarse-tune signal includes a plurality of bits encoding a number, and wherein to generate the coarse-tune signal, the frequency synthesizer circuit is further configured, in response to detecting a start of a given sub-ramp of the plurality of sub-ramps, to decrement the number by a constant value.

14. The apparatus of claim 13, wherein the frequency synthesizer circuit is further configured to sample the tune signal at a plurality of time points to generate a plurality of samples.

15. The apparatus of claim 14, wherein the frequency synthesizer circuit is further configured to align the coarse-tune signal and the fine-tune signal using the plurality of samples.

16. The apparatus of claim 14, wherein the frequency synthesizer circuit is further configured to adjust a duration of a given sub-ramp of the plurality of sub-ramps using the plurality of samples.

17. The apparatus of claim 16, wherein the frequency synthesizer circuit includes a voltage-controlled oscillator circuit, and wherein to modulate the frequency of the oscillator signal, the frequency synthesizer circuit is further configured to:

adjust a first value of a first varactor coupled to an output node of the voltage-controlled oscillator circuit using the tune signal;

adjust a second value of a second varactor coupled to the output node of the voltage-controlled oscillator circuit using the fine-tune signal; and adjust a number of capacitors coupled to the output node of the voltage-controlled oscillator circuit using the coarse-tune signal.

* * * * *